United States Patent [19]

Jeon et al.

[11] Patent Number: 5,758,396
[45] Date of Patent: *Jun. 2, 1998

[54] METHOD OF MANUFACTURING A PIEZOELECTRIC ACTUATOR ARRAY

[75] Inventors: Yong-Bae Jeon; Dong-Kuk Kim, both of Seoul, Rep. of Korea

[73] Assignee: Daewoo Electronics Co., Ltd., Seoul, Rep. of Korea

[*] Notice: The terminal 32 months of this patent has been disclaimed.

[21] Appl. No.: 239,173

[22] Filed: May 4, 1994

[30] Foreign Application Priority Data

May 4, 1993 [KR] Rep. of Korea ............... 1993-7671

[51] Int. Cl.$^6$ ............................................. H01L 41/22
[52] U.S. Cl. ............................................. 29/25.35; 310/334
[58] Field of Search ............................. 29/25.35; 310/328, 310/334–337

[56] References Cited

U.S. PATENT DOCUMENTS

| | | | |
|---|---|---|---|
| 4,398,325 | 8/1983 | Piaget et al. | 29/25.35 |
| 5,359,760 | 11/1994 | Busse et al. | 29/25.35 |
| 5,457,863 | 10/1995 | Thomas, III et al. | 29/25.35 |

Primary Examiner—Carl E. Hall
Attorney, Agent, or Firm—Anderson Kill & Olick, P.C.

[57] ABSTRACT

An array of M×N piezoelectric actuators is prepared by:

(1) forming a multilayered ceramic structure having M layers of a first conductive metallization and M+1 layers of a piezoelectric material;

(2) obtaining a composite ceramic wafer by slicing the multilayered ceramic structure in a direction normal to the layers of the first conductive metallization;

(3) providing a plurality of regularly spaced horizontally directional trenches running parallel to each other wherein each of the trenches is located at an equidistance from two adjacent layers of the first conductive metallization;

(4) depositing a first and second external electrode layers;

(5) polarizing the pair of layers of the piezoelectric material located between the first and second external electrode layers;

(6) forming N−1 regularly spaced vertically directional cuts on the poled composite ceramic wafer prepared using steps (3), (4) and (5) to thereby obtain the array of M×N piezoelectric actuators.

7 Claims, 5 Drawing Sheets

METHOD OF MANUFACTURING A PIEZOELECTRIC ACTUATOR ARRAY

FIELD OF THE INVENTION

The present invention relates to an optical projection system; and, more particularly, to a piezoelectric actuator array and an improved method for manufacturing same for use in the system.

BACKGROUND OF THE INVENTION

Among the various video display systems available in the art, an optical projection system is known to be capable of providing a high quality display in a large scale. In such an optical projection system, light from a lamp is uniformly illuminated onto, e.g., an array of M×N mirrors. The array of M×N mirrors is mounted on an array of actuators which includes a corresponding number, i.e., M×N, of actuators such that each of the mirrors is coupled with each of the actuators. The actuators may be made of an electrodisplacive material such as piezoelectric or electrostrictive material which deforms in response to an electric field applied thereto.

When a reflected light beam from each of the mirrors is incident upon an aperture of a baffle, by applying an electrical signal to each of the actuators, the relative position of each of the mirrors to the incident light beam can be altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In a copending, commonly owned application, U.S. Ser. No. 08/678,893, entitled "ACTUATOR ARRAY AND METHOD FOR THE MANUFACTURE THEREOF", there is disclosed a method for manufacturing an array of M×N piezoelectric actuators for use in the above-described optical projection system from a poled multiple layer structure comprising M+1 layers of a piezoelectric material and M layers of an electrode wherein each layer of the piezoelectric material has a thickness ranging between 150 μm and 300 μm, and each layer of the electrode is placed between two layers of the piezoelectric material.

The poled multiple layer structure used in constructing such an actuator array is normally manufactured by: (1) producing M+1 layers of a piezoelectric material having a specified thickness by tape casting a slurry thereof; (2) coating on one side of each of the individual layers with an electrically conductive material; (3) stacking and pressing the coated layers of the piezoelectric material into a block; (4) sintering the block to produce a multiple layer structure; and (5) obtaining a poled multiple layer structure by polarizing the layers of the piezoelectric material in a same direction by applying a DC voltage to the multiple layer structure in a direction normal to the layers of the electrically conductive material.

One of the major problems associated with the manufacturing of the poled multiple layer structure is that a high level of DC voltage must be applied to the multiple layer structure during the poling thereof. The magnitude of the DC voltage required in poling a multiple layer structure made of M+1 layer of a piezoelectric material, $V_T$, is governed by the following relationship:

$$V_T \geq V_P \times t \times (M+1)$$

wherein $V_P$ represents the threshold electric field for polarizing a piezoelectric ceramic, normally ranging between 1.5 V/μm and 3.0 V/μm; t, the thickness of each layer; and (M+1), the number of layers. Therefore, in order to pole a multiple layer structure made of, for example, 200 layers of a piezoelectric material, wherein each layer has a thickness of 150 μm, there is required a minimum DC voltage of 45 KV.

When such a large voltage is applied to the multiple layer structure, it often leads either to an electrical breakdown caused by an uneven distribution of the electrical field, i.e., the electric field will become concentrated around the inherent non-uniformities such as pores, thereby exceeding the dielectric strength thereof, or to an electrical degradation characterized by a decrease in the active dielectric thickness which in turn may affect the overall performance of the actuator. The larger the applied voltage is, the greater the chance will be for the above-mentioned events to take place.

SUMMARY OF THE INVENTION

It is, therefore, a primary object of the present invention to provide an improved method for manufacturing an array of piezoelectric actuators from a multiple layer structure made of a piezoelectric material wherein the DC voltage required in poling is substantially reduced.

In accordance with one aspect of the present invention, there is provided an improved method for manufacturing an array of M×N piezoelectric actuators, wherein M and N are integers, for use in an optical projection system, said method comprising the steps of:

(a) forming a multilayered ceramic structure having a top, a bottom and four side surfaces, namely, a first, a second, a third and a fourth side surfaces, wherein the top and the bottom surfaces, the first and the third side surfaces, and the second and the fourth side surfaces are parallel to each other, and being made of M layers of a first conductive metallization and M+1 layers of a piezoelectric material, wherein each layer of the first conductive metallization is placed between two layers of the piezoelectric material;

(b) slicing said multilayered ceramic structure along a plane perpendicular to the layers of the first conductive metallization and parallel to one of the four side surfaces resulting in a composite ceramic wafer having a flat surface, wherein the piezoelectric material is evenly separated by said M layers of the first conductive metallization;

(c) providing on the entirety of said flat surface of said composite ceramic wafer M+1 regularly spaced horizontally directional identical trenches wherein each of said trenches has a first side surface, a second side surface and a bottom surface, runs parallel to each other, is located at an equidistance from two adjacent layers of the first conductive metallization and is separated from each other by a barrier having a top;

(d) constructing a composite ceramic body by forming first M+1 and second M+1 external electrode layers of a second conductive metallization on the first and the second side surfaces of said M+1 trenches, respectively;

(e) preparing a poled composite ceramic body by applying a DC voltage between the first and the second external electrode layers to thereby polarize the piezoelectric material located therebetween in a same direction; and (f) forming N−1 regularly spaced vertically directional cuts on said poled composite ceramic body to thereby obtain the array of M×N piezoelectric actuators.

In accordance with another aspect of the present invention, there is provided an array of M×N piezoelectric actuators, wherein each of the M×N piezoelectric actuators comprises a pair of layers of a piezoelectric material, a layer of a first conductive metallization located between the pair of layers of the piezoelectric material, and a first and a second external electrode layers of a second conductive metallization provided on the respective external sides thereof. In the actuator array, the first conductive metallization layer functions as the common signal electrode; and the first and the second electrode layers serve as the reference electrodes.

BRIEF DESCRIPTION OF THE DRAWINGS

The above and other objects, and features of the present invention will become apparent from the following description of preferred embodiments given in conjunction with the accompanying drawings, wherein.

DETAILED DESCRIPTION OF THE PREFERRED EMBODIMENTS

Figure 1A:
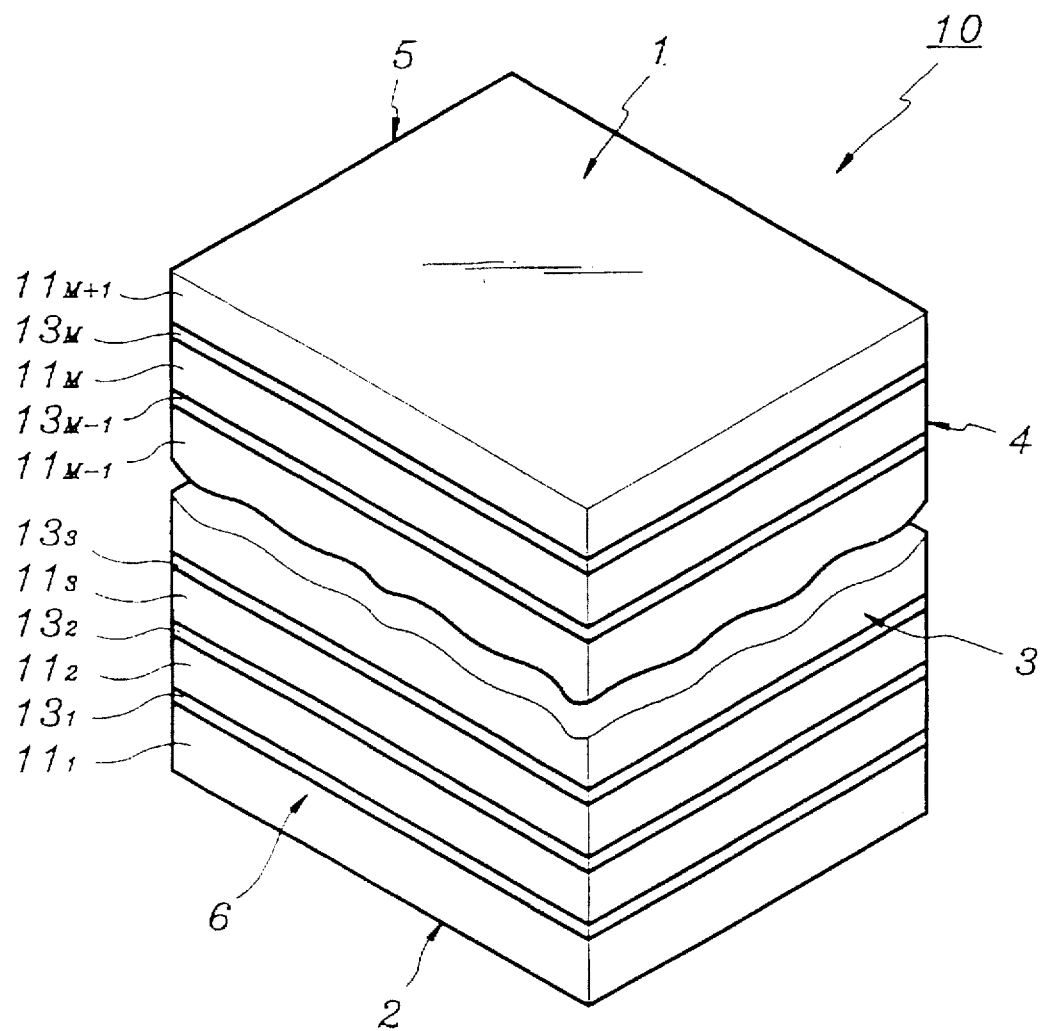
FIGS. 1A to 1I illustrate the steps used in constructing an array of M×N piezoelectric actuators in accordance with the present invention.
Figure 1B:
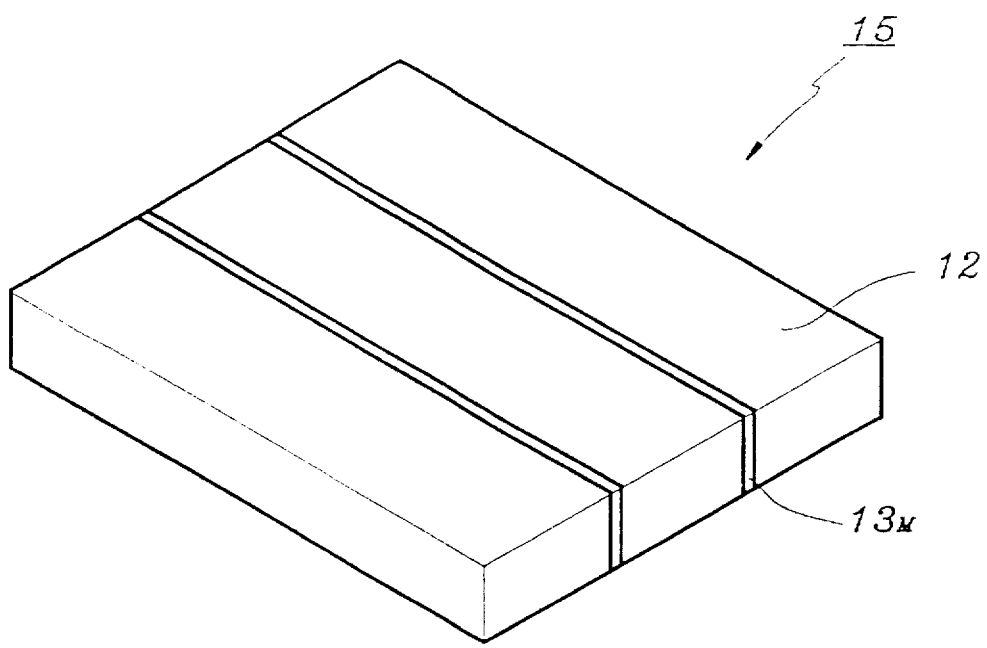
Figure 1C:
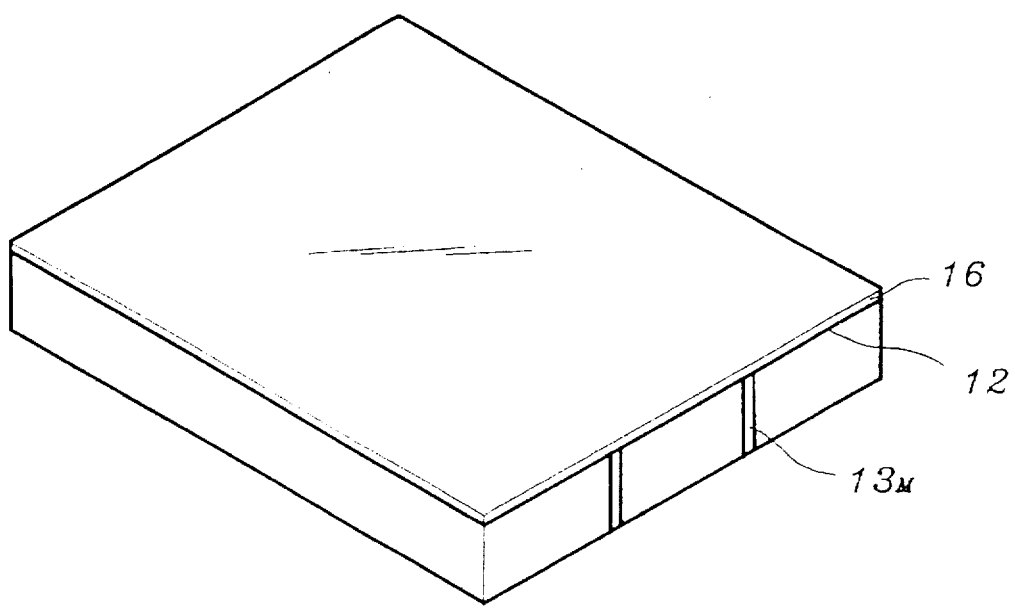

In accordance with the present invention, the method for manufacturing the inventive array of M×N piezoelectric actuators begins with the preparation of a multilayered ceramic structure 10, having M layers of a first conductive metallization $13_M$ and M+1 layers $11_{M+1}$ of a piezoelectric material, e.g., lead zirconium titanate (PZT), wherein each layer of the first conductive metallization $13_M$ is placed between two layers of the piezoelectric material as shown in FIG. 1A. The layers of the first conduction metallization $13_M$ are comprised of platinum (Pt), or palladium (Pd) or palladium/silver (Pd/Ag). Furthermore, the multilayered structure has a top, a bottom, a first, a second, a third, and a fourth side surfaces 1,2,3,4,5,6, wherein the top and the bottom surfaces 1,2, the first and the third side surfaces 3,5, and the second and the fourth side surfaces 4,6, are parallel to each other. The multilayered ceramic structure shown in FIG. 1A can be obtained by utilizing a conventional method well known in the art for manufacturing multilayered ceramic capacitors. The multilayered ceramic structure 10 is sliced along a plane perpendicular to the layers of the first conductive metallization $13_M$ and parallel to one of the four side surfaces, thereby forming a composite ceramic wafer 15 shown in FIG. 1B, having a flat surface 12, wherein the piezoelectric material is evenly eparated by M layers of the first metallization $13_M$. In the subsequent step, the flat surface 12 is covered with a thin layer 16 of a polymer such as photoresist as shown in FIG. 1C.

Figure 1D:
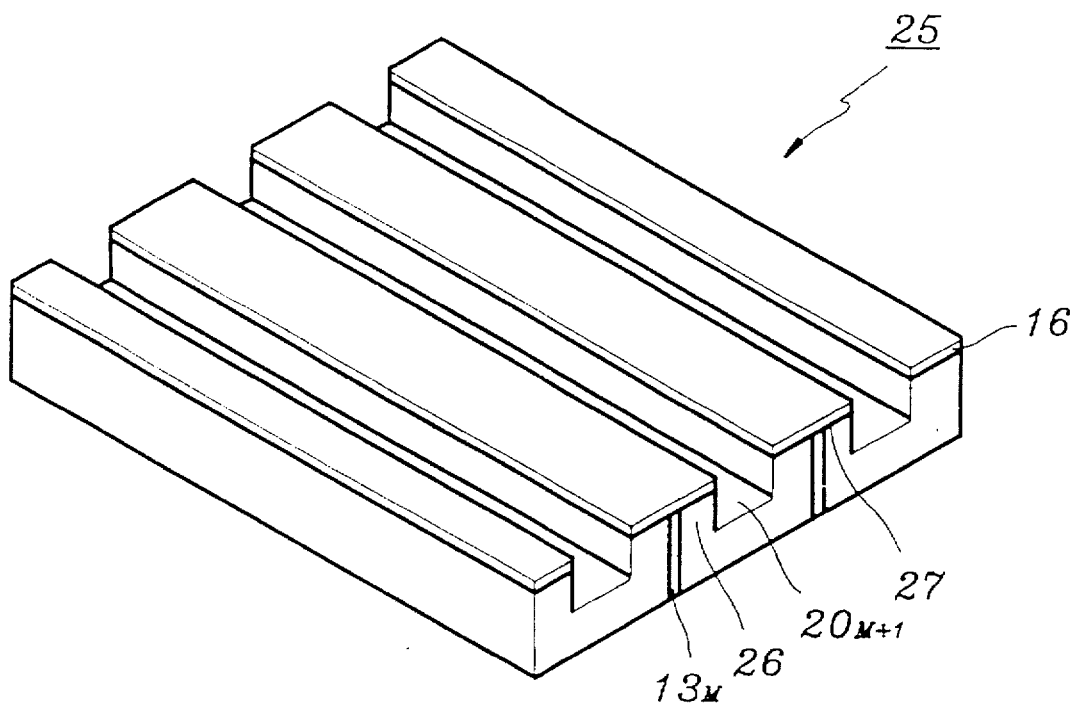
Figure 1E:
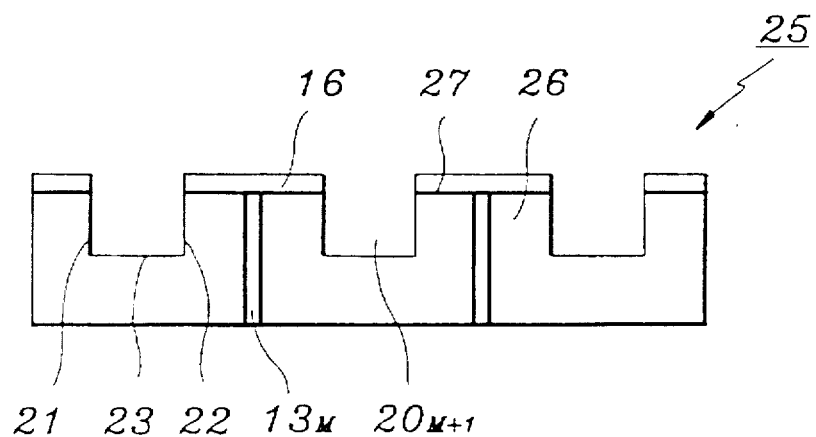

Thereafter, as shown in FIGS. 1D and 1E, there are formed, on the entire flat surface 12 covered with the thin polymeric layer 16, M+1 regularly spaced horizontally directional trenches $20_{M+1}$ of an identical size, having substantially square edges, running parallel to each other, wherein each of the trenches $20_{M+1}$ has a first side surface, a second side surface 21, 22, and a bottom surface 23, resulting in a trenched ceramic wafer 25. Furthermore, each of the trenches $20_{M+1}$ is located at an equidistance from two adjacent layers of the first conductive metallization $13_M$ and is separated by a barrier 26 having its top 27 covered with the thin polymeric layer 16. FIG. 1D represents the perspective view of the trenched ceramic wafer 25; and FIG. 1E, the cross-sectional view thereof.

Figure 1F:
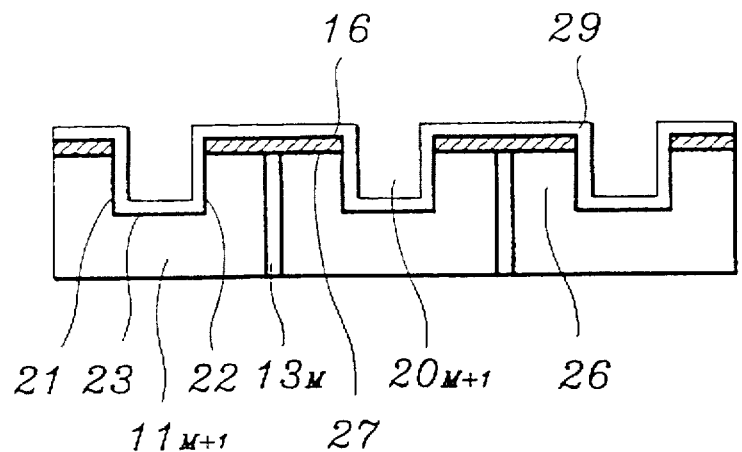
Figure 1G:
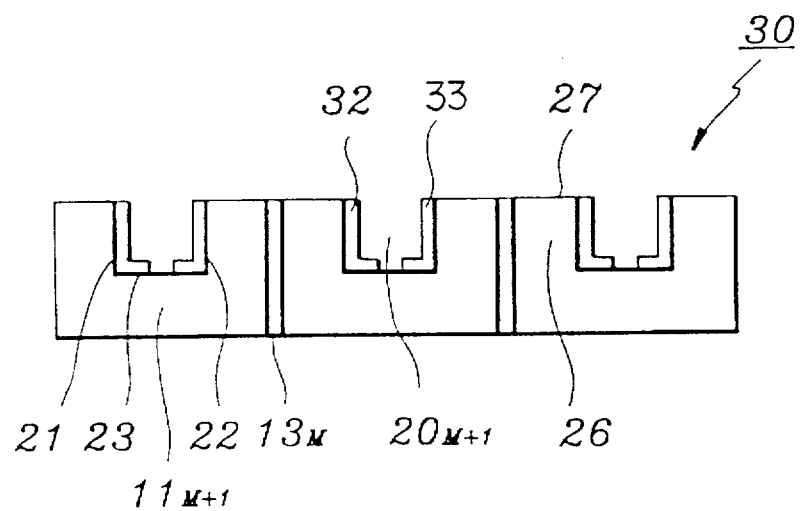
Figure 1H:
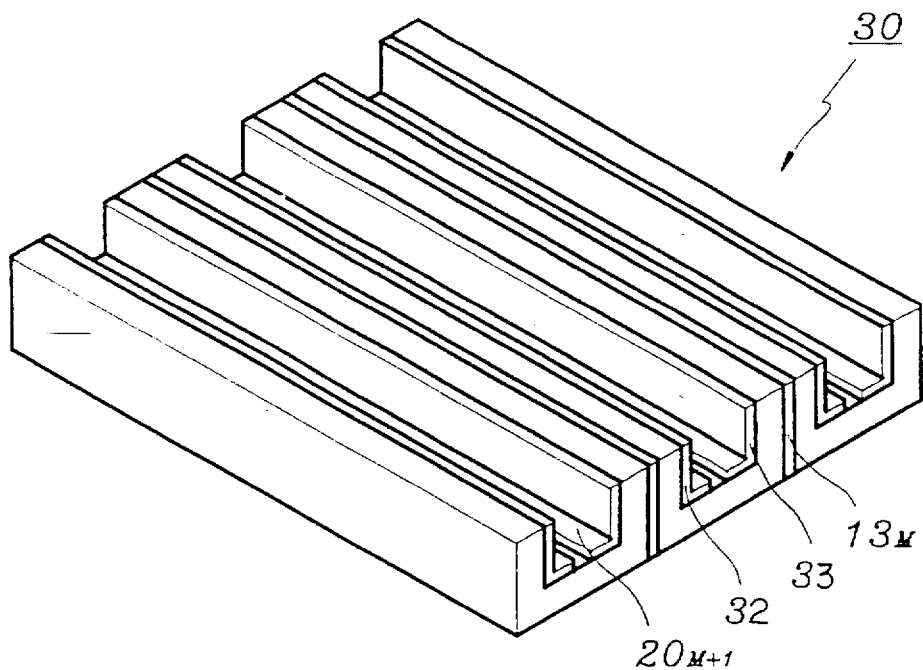

In the subsequent step, as shown in FIGS. 1G and 1H, there is formed a ceramic body 30 having a first and a second external electrode layers 32, 33, comprising either silver (Ag) or aluminum (Al), on the first and the second side surfaces 21, 22 and the bottom surface 23 of the trenches $20_{M+1}$, disjointed at the middle of the bottom surface 23 of the trenches, $20_{M+1}$, using the following steps: (1) depositing a second conductive metallization 29, comprising either silver (Ag) or aluminum (Al), on the entire top surface of the shaped ceramic wafer 25 including the thin polymeric layer 16 on the top 27 of the barriers 26, the first and the second side surfaces 21, 22 and the bottom surface 23 of the trenches $20_{M+1}$ as shown in FIG. 1F; (2) removing the second conductive metallization 29 formed on the thin polymeric layer 16 by dissolving the latter using an appropriate solvent, e.g., acetone; and (3) disjoining the second conductive metallization formed on the bottom surface along the middle thereof, using, for example, a laser, thereby creating the first and the second external electrode layers. FIG. 1F illustrates the cross sectional view of the shaped ceramic wafer 25 after the top surface thereof has been covered with the second conductive metallization 29; FIG. 1G represents the cross sectional view of the ceramic body 30; and FIG. 1H, the perspective view thereof.

The second conductive metallization 29 is obtained by using such a conventional technique as sputtering or thermal evaporation.

Thereafter, the pair of layers of the piezoelectric material located between the first and the second external electrode layers are polarized in a same direction by applying a DC voltage therebetween. The DC voltage required in this step is only 2/(M+1) of the DC voltage that would be required in poling the multilayered ceramic structure 10 having M+1 layers $11_{M+1}$ of the piezoelectric material and M layers $13_M$ of the first conductive metallization, thereby reducing the chance of an electrical breakdown or an degradation.

Figure 1I:
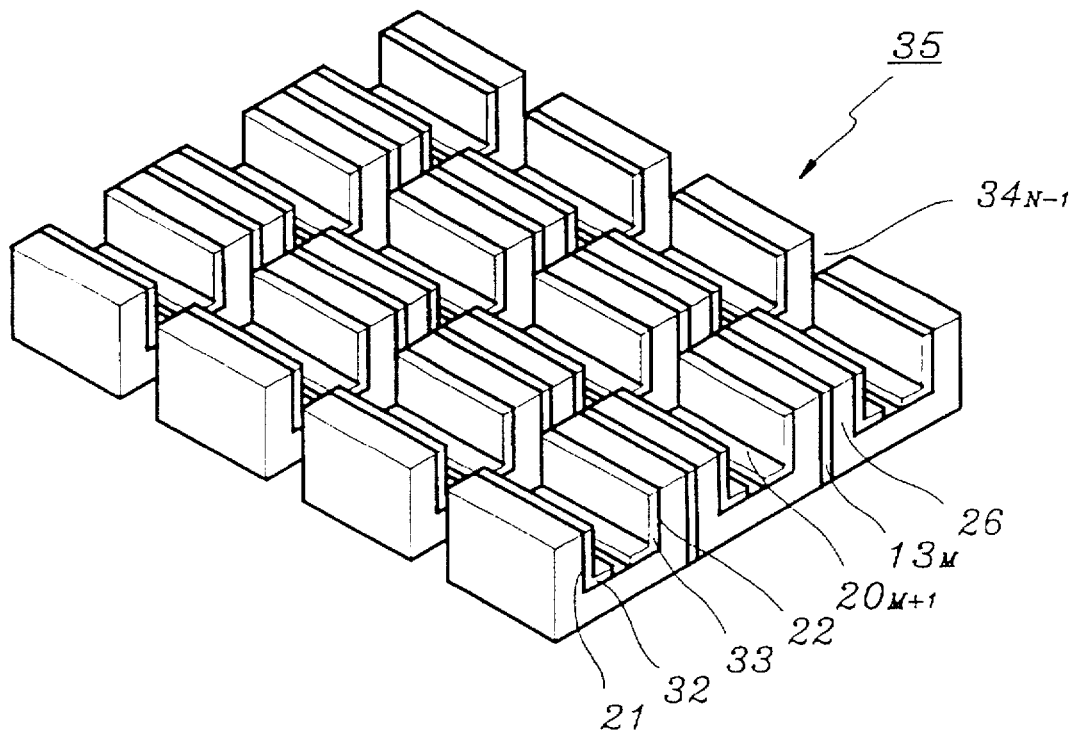

In the subsequent step, there are made, on the ceramic body 30, N−1 regularly spaced vertically directional cuts $34_{N-1}$, resulting in an array of M×N piezoelectric actuators 35 as shown in FIG. 1I.

The array of piezoelectric actuators 35 may be then mounted on a substrate such that the first conductive metallization layer $13_M$ functions as the common signal electrode, and the first and the second external electrode layers 32, 33, as the reference electrodes, respectively; and, therefore, the first conductive metallization layer $13_M$ is connected to a driver, the first and the second electrode layers 32, 33 are interconnected to a common ground potential (not shown).

When a voltage is applied between the first conductive metallization layer $13_M$, and the pair of external electrode layers 32, 33 the piezoelectric material located between them will deform in a direction determined by the polarity of the voltage.

In order for the array 35 shown in FIG. 1I to be used as an actuated mirror array in an optical projection system, said mirrors may need be attached together.

In this connection, there is disclosed a method for attaching the mirrors on such an array of actuators in a copending, commonly owned application, U.S. Ser. No. 08/682,260, entitled "MIRROR ARRAY AND METHOD FOR MANUFACTURE THEREOF", which is incorporated herein by reference.

While the present invention has been shown and described with reference to the particular embodiments, it will be apparent to those skilled in the art that many changes and modifications may be made without departing from the spirit and scope of the invention as defined in the appended claims.

What is claimed is:

1. A method for manufacturing an array of M×N piezoelectric actuators for use in an optical projection system, said method comprising the steps of:

(a) forming a multilayered ceramic structure made of M layers of a first conductive metallization and M+1 layers of a piezoelectric material, wherein each layer of the first conductive metallization is placed between two layers of the piezoelectric material;

(b) slicing said multilayered ceramic structure along a plane perpendicular to the layers of the first conductive metallization, resulting in a composite ceramic wafer having a flat surface, wherein the piezoelectric material is evenly separated by said M layers of the first conductive metallization;

(c) providing on the entirety of said flat surface of said composite ceramic wafer M+1 regularly spaced horizontally directional identical trenches wherein each of said trenches has a first side surface, a second side surface and a bottom surface, runs parallel to each other, is located at an equidistance from two adjacent layers of the first conductive metallization and is separated from each other by a barrier having a top;

(d) constructing a composite ceramic body by forming first M+1 and second M+1 external electrode layers made up of a second conductive metallization on the first and the second side surfaces of said M+1 trenches, respectively;

(e) preparing a poled composite ceramic body by applying a DC voltage between the first and the second external electrode layers to thereby polarize the piezoelectric material located therebetween in a same direction; and (f) forming N−1 regularly spaced vertically directional cuts on said poled composite ceramic body to thereby obtain the array of M×N piezoelectric actuators.

2. The method of claim 1, wherein the first conductive metallization layer in step (a) is comprised of platinum, palladium or palladium/silver.

3. The method of claim 1, wherein said trenches are formed in step (c) after said flat surface in step (b) has been completely covered with a thin layer of a polymer.

4. The method of claim 1, wherein the second conductive metallization in step (d) is comprised of aluminum or silver.

5. The method of claim 4, wherein the second conductive metallization in step (d) is also formed on the top surface of the barrier referred to in step (c).

6. The method of claim 5, wherein the second conductive metallization formed on the top surface of the barrier is removed by dissolving said thin polymeric layer in a solvent.

7. The method of claim 6, wherein the second conductive metallization formed on the bottom surface of each of said trenches is disjoined along the middle thereof, forming the first and the second external electrodes.

* * * * *

UNITED STATES PATENT AND TRADEMARK OFFICE
CERTIFICATE OF CORRECTION

PATENT NO. : 5,758,396
DATED : June 2, 1998
INVENTOR(S) : Yong-Bae Jeon, et al

It is certified that error appears in the above-indentified patent and that said Letters Patent is hereby corrected as shown below:

On title page, item

[30] Foreign Application Priority Data

May 4, 1993    [KR]    Rep. of Korea    93-7671

Signed and Sealed this

Eleventh Day of August 1998

*Attest:*

BRUCE LEHMAN

*Attesting Officer*    *Commissioner of Patents and Trademarks*